(12) United States Patent
Mayer et al.

(10) Patent No.: US 10,186,458 B2
(45) Date of Patent: Jan. 22, 2019

(54) COMPONENT AND METHOD OF MANUFACTURING A COMPONENT USING AN ULTRATHIN CARRIER

(75) Inventors: Karl Mayer, Villach (AT); Evelyn Napetschnig, Diex (AT); Michael Pinczolits, Villach (AT); Michael Sternad, Klagenfurt (AT); Michael Roesner, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 852 days.

(21) Appl. No.: 13/542,655

(22) Filed: Jul. 5, 2012

(65) Prior Publication Data

US 2014/0008805 A1 Jan. 9, 2014

(51) Int. Cl.

| | |
|---|---|
| *H01L 21/78* | (2006.01) |
| *H01L 21/50* | (2006.01) |
| *H01L 21/56* | (2006.01) |
| *H01L 23/48* | (2006.01) |
| *H01L 23/00* | (2006.01) |
| *H01L 23/31* | (2006.01) |

(52) U.S. Cl.
CPC ............ *H01L 21/78* (2013.01); *H01L 24/29* (2013.01); *H01L 24/32* (2013.01); *H01L 23/3121* (2013.01); *H01L 24/40* (2013.01); *H01L 24/48* (2013.01); *H01L 24/73* (2013.01); *H01L 2224/29101* (2013.01); *H01L 2224/29147* (2013.01); *H01L 2224/32245* (2013.01); *H01L 2224/40247* (2013.01); *H01L 2224/48091* (2013.01); *H01L 2224/48247* (2013.01); *H01L 2224/73263* (2013.01); *H01L 2224/73265* (2013.01); *H01L 2924/00014* (2013.01); *H01L 2924/014* (2013.01); *H01L 2924/01322* (2013.01); *H01L 2924/12042* (2013.01); *H01L 2924/1301* (2013.01); *H01L 2924/1305* (2013.01); *H01L 2924/13055* (2013.01); *H01L 2924/13091* (2013.01); *H01L 2924/181* (2013.01)

(58) Field of Classification Search
CPC ......... H01L 21/78; H01L 24/32; H01L 24/29; H01L 21/7806; H01L 21/782; H01L 21/784; H01L 21/786; H01L 21/4882; H01L 23/544
USPC .......................................... 257/772; 438/107
See application file for complete search history.

(56) References Cited

U.S. PATENT DOCUMENTS 5,759,873 A * 6/1998 Kata et al. .................... 438/118
6,303,978 B1 10/2001 Daniels et al.
(Continued)

FOREIGN PATENT DOCUMENTS

| CN | 1839470 A | 9/2006 |
|---|---|---|
| CN | 101150157 A | 3/2008 |

Primary Examiner — Mary Wilczewski
(74) Attorney, Agent, or Firm — Slater Matsil, LLP

(57) ABSTRACT

A system and method for manufacturing a packaged component are disclosed. An embodiment comprises forming a plurality of components on a carrier, the plurality of components being separated from each other by kerf regions on a front side of the carrier and forming a metal pattern on a backside of the carrier, wherein the metal pattern covers the backside of the carrier except over regions corresponding to the kerf regions. The method further comprises generating the component by separating the carrier.

18 Claims, 5 Drawing Sheets

(56) References Cited

U.S. PATENT DOCUMENTS

| | | | | |
|---|---|---|---|---|
| 7,202,141 B2* | 4/2007 | Park | ................... | B23K 26/0732 257/E21.347 |
| 7,221,059 B2* | 5/2007 | Farnworth | .......... | H01L 21/3043 257/774 |
| 8,585,915 B2* | 11/2013 | Pratt | ....................... | G03F 9/708 216/41 |
| 8,736,047 B2* | 5/2014 | Yoshimi | ................ | H01L 23/367 257/713 |
| 8,741,695 B2* | 6/2014 | Oka | ...................... | H01L 23/142 257/691 |
| 8,803,312 B2* | 8/2014 | von Koblinski | ........ | H01L 21/56 257/704 |
| 8,853,868 B2* | 10/2014 | Pratt | ....................... | G03F 9/708 257/797 |
| 8,946,894 B2* | 2/2015 | Railkar | ................... | H01L 24/83 257/633 |
| 9,698,105 B2* | 7/2017 | Luan | ..................... | H01L 23/562 |
| 9,786,611 B2* | 10/2017 | Hashimoto | ........... | H01L 23/562 |
| 2003/0189212 A1* | 10/2003 | Yoo | .................... | H01L 33/0079 257/79 |
| 2004/0026709 A1* | 2/2004 | Bader | ................ | H01L 33/0079 257/103 |
| 2005/0130390 A1* | 6/2005 | Andrews et al. | ............. | 438/458 |
| 2005/0151268 A1* | 7/2005 | Boyd et al. | ................... | 257/778 |
| 2005/0181540 A1* | 8/2005 | Farnworth | .......... | H01L 21/3043 438/113 |
| 2005/0227455 A1* | 10/2005 | Park | ................... | B23K 26/0732 438/458 |
| 2007/0228554 A1* | 10/2007 | Yoshimi | ................ | H01L 23/367 257/712 |
| 2007/0231963 A1* | 10/2007 | Doan | ................. | H01L 33/0079 438/107 |
| 2008/0003720 A1 | 1/2008 | Lu et al. | | |
| 2008/0210970 A1 | 9/2008 | Kang et al. | | |
| 2009/0072391 A1* | 3/2009 | Kolan et al. | ................... | 257/737 |
| 2009/0110878 A1* | 4/2009 | Pratt | ....................... | G03F 9/708 428/137 |
| 2009/0227070 A1* | 9/2009 | Miyajima | ............ | H01L 21/561 438/113 |
| 2010/0051322 A1* | 3/2010 | Kim et al. | ..................... | 174/250 |
| 2010/0276706 A1* | 11/2010 | Herrmann | ........................ | 257/89 |
| 2011/0046764 A1* | 2/2011 | Kan | ................................ | 700/98 |
| 2012/0012994 A1* | 1/2012 | von Koblinski | ........ | H01L 21/56 257/680 |
| 2012/0032298 A1* | 2/2012 | Miyagawa | ............ | H01L 21/561 257/531 |
| 2012/0288698 A1* | 11/2012 | Moldovan | ................ | C25D 1/04 428/216 |
| 2013/0217188 A1* | 8/2013 | Wang | .................... | H01L 21/563 438/118 |
| 2013/0228905 A1* | 9/2013 | von Koblinski | ........ | H01L 21/78 257/668 |
| 2013/0320515 A1* | 12/2013 | Viswanathan | .......... | H01L 24/97 257/676 |
| 2013/0328183 A1* | 12/2013 | von Koblinski | ........ | H01L 21/56 257/692 |
| 2014/0008805 A1* | 1/2014 | Mayer | ..................... | H01L 21/78 257/772 |
| 2014/0048953 A1* | 2/2014 | Pratt | ....................... | G03F 9/708 257/774 |
| 2014/0231815 A1* | 8/2014 | Railkar | ............... | H01L 23/3735 257/76 |
| 2014/0346636 A1* | 11/2014 | Miyagawa | ............ | H01L 21/561 257/531 |
| 2015/0140740 A1* | 5/2015 | Moldovan | ................ | C25D 1/04 438/122 |
| 2016/0035648 A1* | 2/2016 | Zhou | ................... | H01L 23/3738 257/713 |
| 2016/0104656 A1* | 4/2016 | Luan | ...................... | H01L 24/97 257/738 |
| 2016/0148861 A1* | 5/2016 | Liang | ................ | H01L 23/49517 257/676 |
| 2017/0162519 A1* | 6/2017 | Ko | ....................... | H01L 21/4882 |
| 2017/0323802 A1* | 11/2017 | Zhou | ....................... | H01L 25/50 |

* cited by examiner

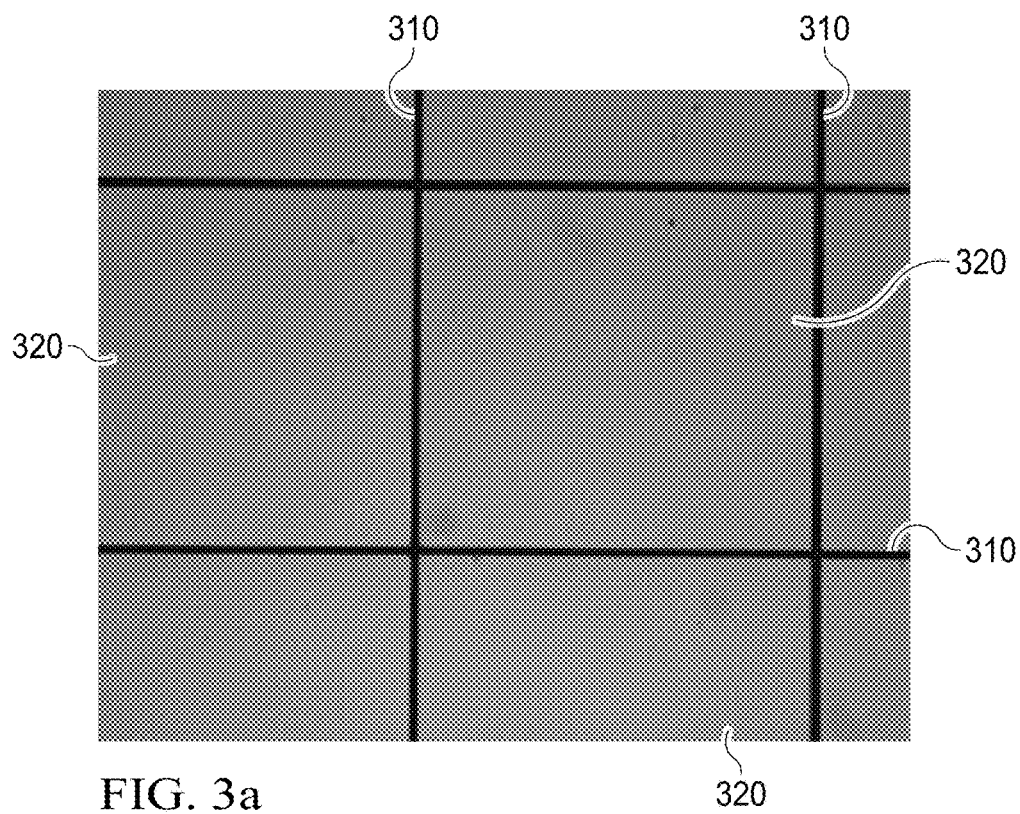
FIG. 3a
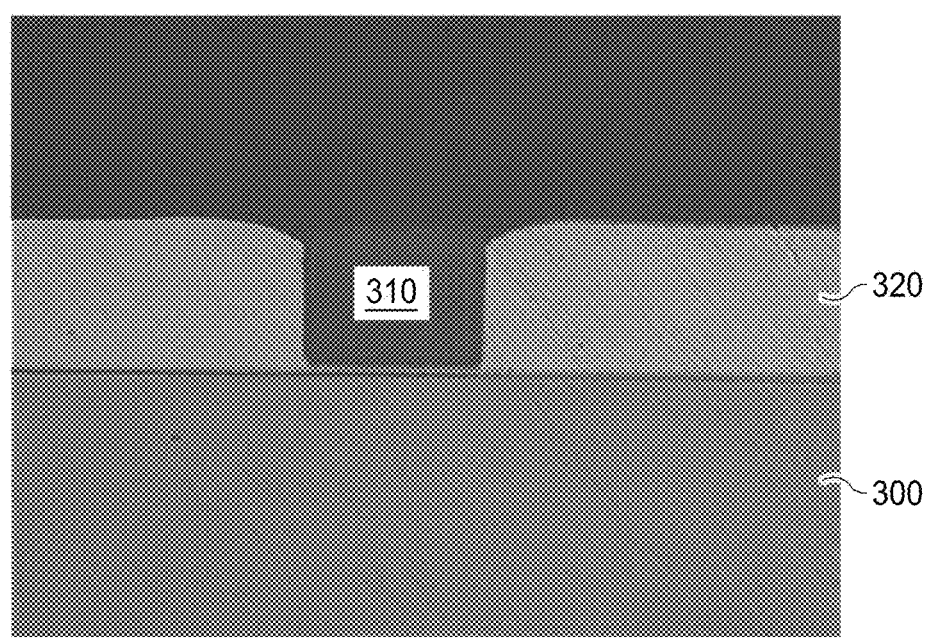
FIG. 3b
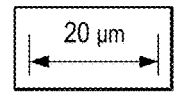

COMPONENT AND METHOD OF MANUFACTURING A COMPONENT USING AN ULTRATHIN CARRIER

TECHNICAL FIELD

Embodiments of the invention relate generally to a method of manufacture a component, and in particular embodiments, to a method of manufacture a component using an ultrathin wafer.

BACKGROUND

Processing ultrathin wafers is difficult because they break easier than regular wafers during dicing. Moreover, the separated chips may break during the pick-up process or while wire bonded.

SUMMARY OF THE INVENTION

In accordance with an embodiment of the present invention, a method for manufacturing a component comprises forming a plurality of components on a carrier, the plurality of components being separated from each other by kerf regions on a front side of the carrier and forming a metal pattern on a backside of the carrier, wherein the metal pattern covers the backside of the carrier except over regions corresponding to the kerf regions. The method further comprises generating the component by separating the carrier.

In accordance with an embodiment of the present invention, a method for manufacturing a component comprises forming a plurality of components on a carrier and forming a metal pattern on a backside of the carrier, the metal pattern comprising free standing metal blocks separated by spaces. The method further comprises forming the component by separating the carrier along the spaces.

In accordance with an embodiment of the present invention, a method for manufacturing a wafer comprises forming kerf regions and chips on a first main surface of the wafer and forming a metal pattern on a second main surface of the wafer, wherein the metal pattern covers the second main surface of the wafer except over regions corresponding to the kerf regions.

In accordance with an embodiment of the present invention, a packaged semiconductor device comprises a carrier and a component disposed on the carrier, the component comprising a substrate having a thickness of about 20 µm or less and a metal block comprising a thickness of about 20 µm or more. The packaged semiconductor device further comprises a connection layer connecting the carrier and the component, and a conductive wire or a conductive clip connecting a component contact pad of the component with a carrier contact pad of the carrier. The packaged semiconductor device finally comprises an encapsulant encapsulating the component.

BRIEF DESCRIPTION OF THE DRAWINGS

For a more complete understanding of the present invention, and the advantages thereof, reference is now made to the following descriptions taken in conjunction with the accompanying drawings, in which:

FIG. 3*a* shows an embodiment of a top surface of a patterned metal layer on the backside of a carrier;

FIG. 3*b* shows an embodiment of a cross-section of a patterned metal layer on the backside of a carrier;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a thin wafer processing method and device. The invention may also be applied, however, to other carrier processing methods and devices.

A safe and secure processing of conventional wafers and chips typically requires a silicon thickness of about 60 µm or more for the substrate of the wafers or chips. Processing of wafers or chips below this thickness is difficult because there are serious handling problems in front end and back end processes. For example, when the chips are removed from the sawing foil (pick-up) they may break or fracture due to their thin silicon substrate. Moreover, when the chips are wire bonded they may break or crack due to the mechanical pressure and the ultrasound applied to the chips. A 100% loss of the processed chips may be experienced.

Embodiments of the invention provide mechanical stabilization of ultra-thin carriers and components. Embodiments of the invention further provide an excellent electrical and thermal contact on the backside of a component. Embodiments of the invention provide a void free backside contact for a component. An advantage of the mechanical stabilization of the component and the carrier is a reliable handling of the component and the carrier with an ultra-thin substrate. A further advantage of components with ultra-thin substrate is that the electrical and thermal parameters are improved relative to components with regular sized substrate. For example, the electrical resistance of the components may be reduced because of the thinner substrate.

Figure 1:
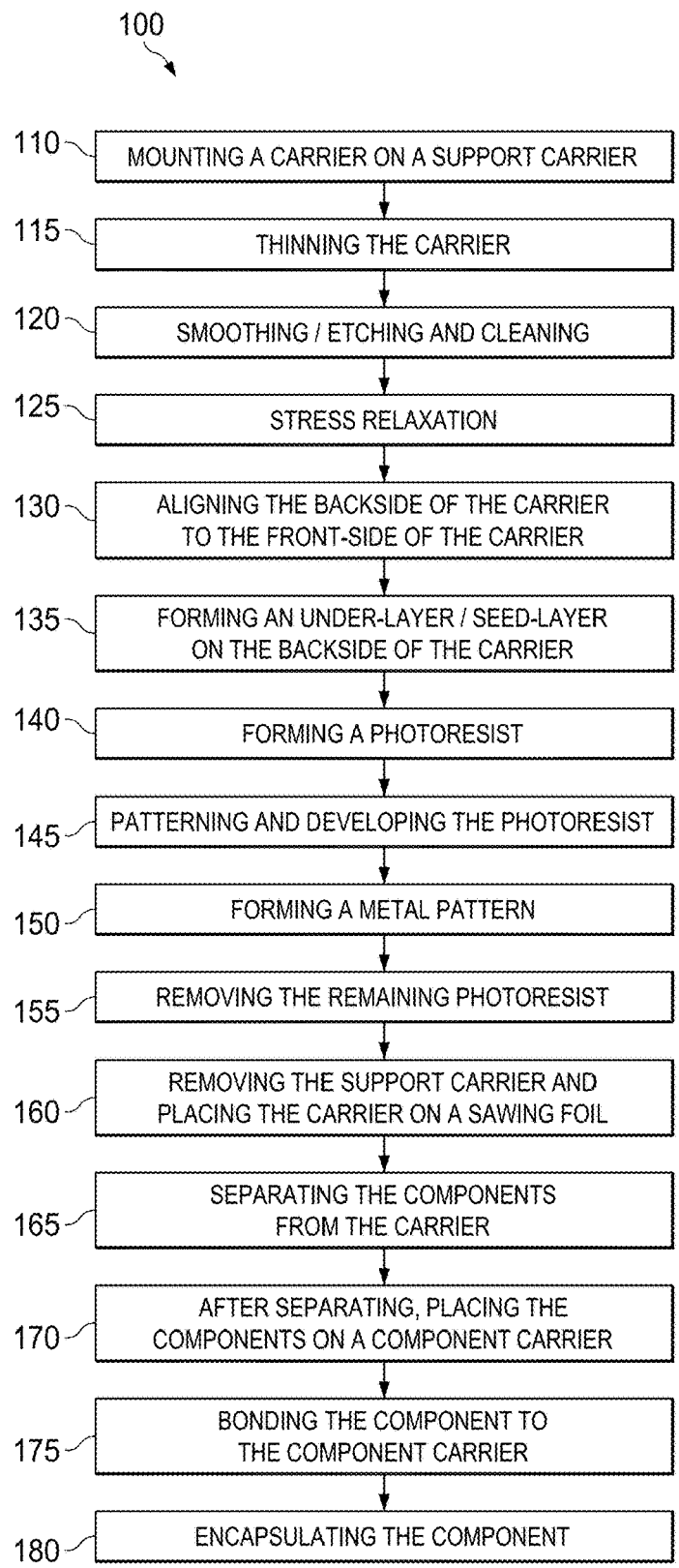
FIG. 1 shows a flow chart of an embodiment of a method to manufacture a component package.

FIG. 1 shows a flow chart 100 of an embodiment of a method for manufacturing a packaged electric component. In a first step 110, a carrier is mounted on a support carrier. The carrier may be a workpiece, a substrate, a wafer, or a printed circuit board (PCB).

The carrier may be a semiconductor substrate such as silicon or germanium, or a compound substrate such as SiGe, GaAs, InP, GaN or SiC. Alternatively, the carrier comprises other materials. The substrate may be a single crystal silicon or a silicon-on insulator (SOI). The substrate may be doped or un-doped.

One or more interconnect metallization layers may be arranged on the carrier. A passivation layer is disposed on the interconnect metallization layers forming a top surface or a first main surface of the carrier. The passivation layer may electrical isolate and structure component contacts or component contact pads of the components of the carrier. The passivation layer may comprise SiN, for example. The first main surface is located on the front side of the carrier. The carrier comprises a bottom surface or a second main surface. The second main surface is located on the backside of the carrier.

In one embodiment, the first main surface is the surface where the active areas are predominately disposed and the second main surface is the surface which is active area free or which is predominately active area free.

The carrier comprises a plurality of components such as chips or dies. The component may comprise a discrete device such as a single semiconductor device or an integrated circuit (IC). For example, the component may comprise a power semiconductor device such as a bipolar transistor, an insulated gate bipolar transistor (IGBT), a power MOSFET, a thyristor or a diode. Alternatively, the component may be resistor, a protective device, a capacitor, a sensor or a detector, for example.

The carrier comprises kerfs, kerf lines or kerf regions separating and structuring the components. The carrier is separated, singulated or cut along the kerf lines into single components. The carrier comprises a grid or a pattern of kerf lines in x-direction and in y-directions. The kerf lines are the region along which the components are separated from each other.

The carrier may be attached to a support carrier. The support carrier may be a glass carrier. Alternatively, the support carrier may be semiconductive carrier such as a silicon carrier. In one embodiment, the first main surface of the carrier is glued to the glass carrier so that the second main surface of the carrier is exposed.

In step 115, the carrier is thinned, that is, the thickness of the backside of the carrier is reduced. For example, the substrate is thinned to a thickness of about less than about 40 µm or to a thickness of about less than about 20 µm. Alternatively, the substrate is thinned to a thickness of about 10 µm to about 20 µm. The substrate may be thinned by grinding or abrasive cutting. A mercury cleaning which removes excess glue residues after mounting the carrier to the support carrier may not be carried out because the cleaning step may lead to edge breakings of the component during grinding.

In step 120, the carrier is smoothened and cleaned. For example, the carrier is smoothened applying a wet etch such as an $HNO_3$ and a cleaned applying a water cleaning.

In step 125, an optional stress relaxation is carried out. The stress relaxation may be advantageous because the substrate thickness (after thinning) may be in a same or similar dimension range as the interconnect metallization layers on the front side of the carrier and the CTEs of the substrate and the interconnect metallization layers are different. The stress relaxation may be carried out applying a Cryo process. For example, the Cryo process may be carried out at temperatures of about −70° C.

In step 130, the backside of the carrier is aligned to the front side of the carrier. In one embodiment the front side alignment mark is copied, imaged, mapped or reproduced on the backside of the carrier. Alternatively, the backside of the carrier is aligned with the front side alignment mark. For example, the carrier can be aligned by "seeing through" the substrate of the carrier.

In step 135, optionally an under-layer is formed on the backside of the carrier. The under-layer may be a metal layer. For example, the under-layer may be aluminum (Al) or aluminum alloy, titanium (Ti) or titanium alloy, or a combination thereof. Alternatively, the under-layer may comprise copper (Cu), nickel vanadium (NiV) or silver (Ag). The under-layer may be a layer stack. For example, the under-layer may comprise a first layer adjacent to the carrier and a second layer disposed on the first layer. The first layer may be an adhesion layer and the second layer may be barrier layer. In one example, the first layer comprises an aluminum or aluminum alloy (e.g., 200 nm thick) and the second layer comprises titanium or titanium alloy (e.g., 200 nm thick). The under-layer may be formed by sputtering. Alternatively other deposition processes may be used such as physical vapor deposition (PVD), chemical vapor deposition (CVD) or evaporation.

A seed layer is formed over the under-layer. The seed layer may be a metal layer. For example, the seed layer may be aluminum (Al) or aluminum alloy, copper (Cu) or copper alloy, or a combination thereof. The seed layer may be formed by sputtering. Alternatively other deposition processes may be used such as physical vapor deposition (PVD), chemical vapor deposition (CVD) or evaporation. In one embodiment sputtering is carried out at low temperatures, e.g., at temperatures of about 100° C. In one embodiment the under-layer and the seed layer are formed in a single process forming a layer stack providing a contact, a barrier and a seed layer.

Figure 2:
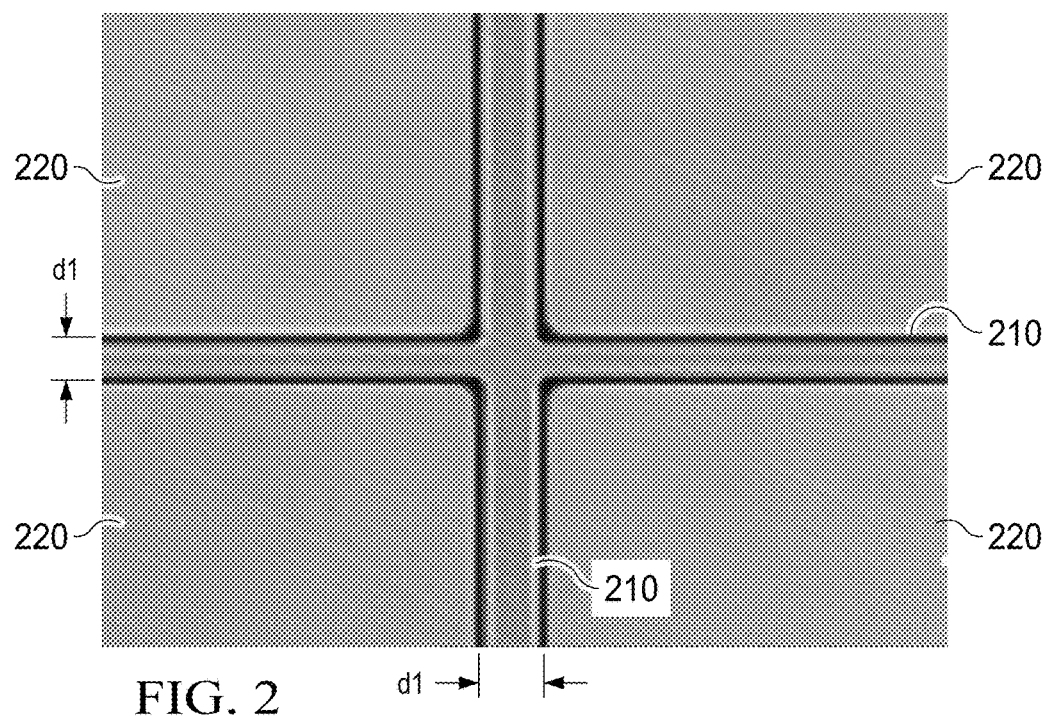
FIG. 2 shows an embodiment of a top surface of a patterned photoresist on the backside of a carrier.

In step 140, a photoresist is formed over the seed layer. The photoresist may be formed by spin-coating. The photoresist may be a resists which enables resist thicknesses larger than about 20 µm. Then, in step 145 the photoresist is patterned and developed. In one embodiment the photoresist is patterned and developed such that the photoresist pattern mirrors or maps the kerf regions or kerf lines on the front side of the carrier. The photoresist is removed over the backside of the components and remains standing over the kerf regions or kerf lines. In one embodiment patterning of the photoresist forms photoresist ridges, fins or bars. The ridges, fins or bars may comprise the form of frames or cross-like bars. The ridges, fins or bars may comprise the form of a circumference of a square or a rectangular. Alternatively, the ridges, fins or bars may comprise other forms. In one embodiment the removed portions of the photoresist may comprise the form of panels, squares, rectangles, checks, or blocks. Alternatively, the removed portions of the photoresist may comprise other forms. FIG. 2 shows a detail of an embodiment of a photoresist pattern on the backside of the carrier. Photoresist ridges, fins or bars 210 remain standing while the photoresist is removed from the areas 220. In one embodiment, the ridges, fins or bars 210 comprise the same thickness $d_1$ in x-direction and in y-direction. The carrier may be cleaned to remove unnecessary organic deposits. For example, the carrier may be cleaned with an $O_2$ plasma.

In step 150, a metal pattern is formed. In one embodiment the metal pattern or metal layer is formed by galvanic plating. The carrier is immersed in a metal bath and the metal pattern (metal blocks) are electro plated from and over the seed layer between the photoresist ridges, fins and bars. For example, the carrier is immersed in a copper (Cu) bath. The metal thickness is adjusted by leaving the carrier a predetermined time in the metal bath. For example, the metal thickness of the copper blocks may be about 20 µm to about 50 µm or about 20 µm to about 100 µm. The metal blocks may be thicker than the substrate of the components. In one embodiment the metal is thicker than the substrate when the metal block is not only configured to be an electrical contact but also configured to be a heat-sink.

An advantage of the electroplating process is that a thick metal pattern can be formed in a comparably short period of time. A further advantage is that the electroplating process provides void free metal blocks and void free interface to the component carrier.

FIG. 3a shows a detail of a top view of an embodiment of a metal pattern or metal layer (e.g., copper) on the backside of the carrier. The metal blocks 320 are spaced apart from each other by the resist ridges, bars or fins 310. FIG. 3b shows a detail of a cross-sectional view of the metal pattern on the backside of the carrier. The resist ridges, fins or bars 310 are placed between the metal blocks 320 over a substrate 300. A seed layer and/or under-layer may be disposed between the substrate 300 and the resist bars/metal blocks 310, 320.

In an embodiment the metal pattern is formed by other fast depositing processes. For example, the metal pattern may be formed by a screen printing process applying an inkjet printer or stencil printing process.

In step 155, the remaining photoresist layer is removed. For example, the photoresist frame or the photoresist ridges, fins or bars are removed. The photoresist is removed by organic liquid media.

Figure 4:
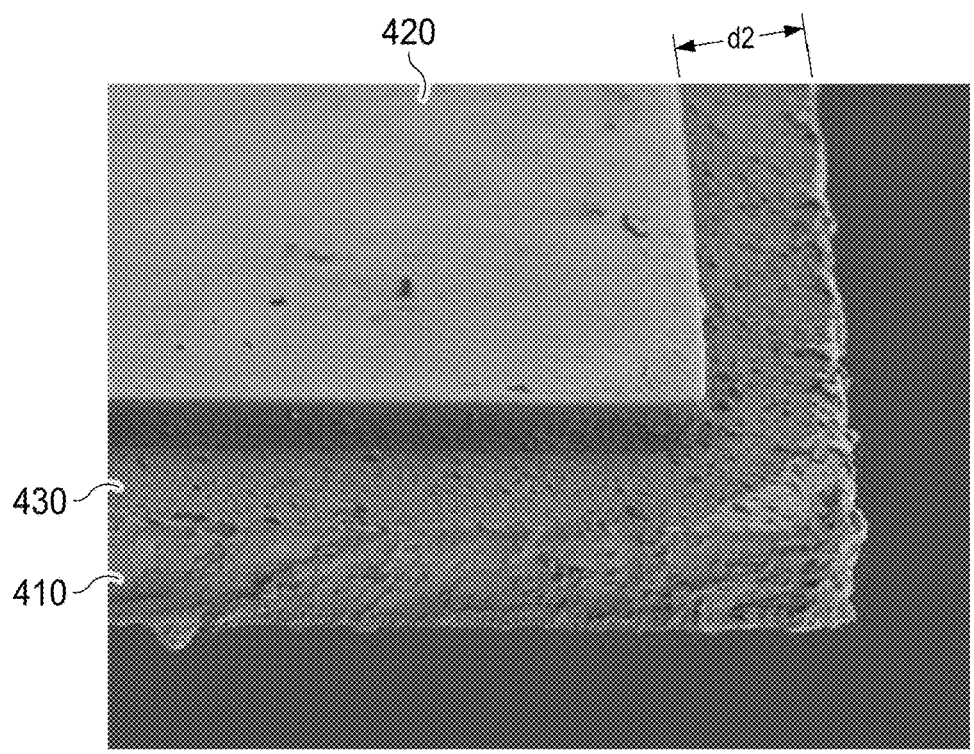
FIG. 4 shows an embodiment of a singulated component having a metal block on the backside.

In step 160, the support carrier and the carrier are placed on a dicing foil. Then the support carrier is removed from the carrier. In step 165, the components are separated, singulated or cut from the carrier. In one embodiment the carrier is singulated using a dicing laser. In one embodiment the carrier is singulated applying a plasma etch using the metal blocks as hard mask. Alternatively the carrier is singulated using a dicing saw. An embodiment of a detail of a component 410 with a backside metal 420 is shown in FIG. 4. FIG. 4 shows a distance d of a rim or gap 430 between the circumference of the component 410 and the circumference of the backside metal block 420. In one embodiment it is advantageous that the distance $d_2$ is as small as possible, e.g., between about 5 μm and about 0 μm.

In step 170, the separated individual components are flipped and assembled on a component carrier. The component carrier may be a workpiece, a substrate, a wafer, or a printed circuit board (PCB). In one embodiment the component carrier is a leadframe comprising a metal such as copper (Cu) or a copper alloy, nickel (Ni) or nickel alloy, silver (Ag) or silver alloys, or a combination thereof.

The component is attached to the component carrier at the component placement area. For example, the metal layer or metal block on the backside of the component is attached to the top surface of the component carrier. In one embodiment the metal layer is bonded to the top surface of the component carrier using a soldering, eutectic bonding or an epoxy bonding. Alternatively, the second main surface is bonded or glued to the top surface of the carrier using an adhesive tape, a solder paste or a solder. In one embodiment the connection between the component and the component carrier is an electrical connection. Alternatively, the connection is an insulating barrier.

In step 175, the component is bonded to the component carrier. For example, component contacts or component contact pads disposed on a top surface or first main surface of the component are bonded to component contacts or component carrier contact pads of the component carrier. The contacts of the component are wire bonded, ball bonded, clip bonded or otherwise bonded to the contacts of the component carrier. The wires or conductive clips comprise a metal such as aluminum (Al), copper (Cu), silver (Ag) or gold (Au).

For example, a first component contact disposed on the first main surface of the component is electrically connected to a first component carrier contact. The component may further comprise a second component contact and/or a third component contact on the first main surface. Alternatively, the component may have other contact pad arrangements on its first main surfaces.

At step 180, the component is encapsulated with a molding compound. In one embodiment the encapsulation material may be a molding compound. The molding compound may comprise a thermoset material or a thermoplastic material. The molding compound may comprise a coarse grained material. In one embodiment the molding compound may be applied to encapsulate the component and at least portions of the component carrier. Alternatively, the encapsulation material may be a laminate material such as a prepreg material.

Optionally, when several of components are placed on the component carrier, the encapsulated component/component carrier may be diced into packaged electric components each comprising a component. For example, the individual packaged electric components are singulated using a dicing saw.

Figure 5A:
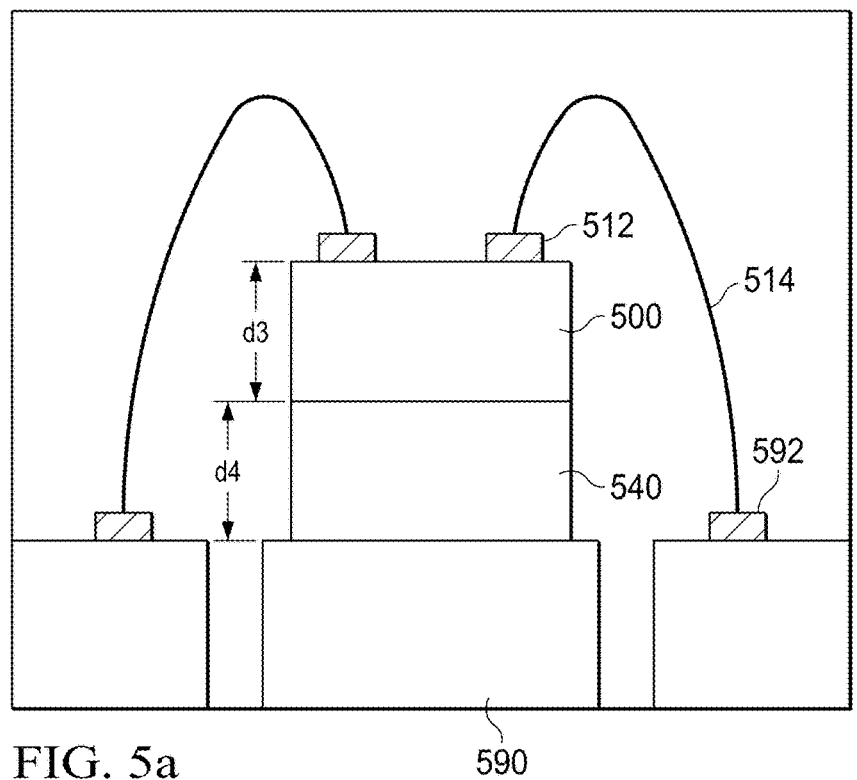
FIG. 5*a* shows an embodiment of a packaged component comprising a metal block on the backside.

FIG. 5a shows a packaged electric component comprising a component 500 having a thickness $d_3$ and a metal block 540 having a thickness $d_4$, wherein $d_3$ is substantially the same as $d_4$. The metal block (e.g., copper) 540 may be soldered to the component carrier (e.g., lead frame) 590. One or more component contact pads 512 of the component 500 are connected via wires or conductive clips 514 to one or more component carrier contact pads 592 of the component carrier 590.

Figure 5B:
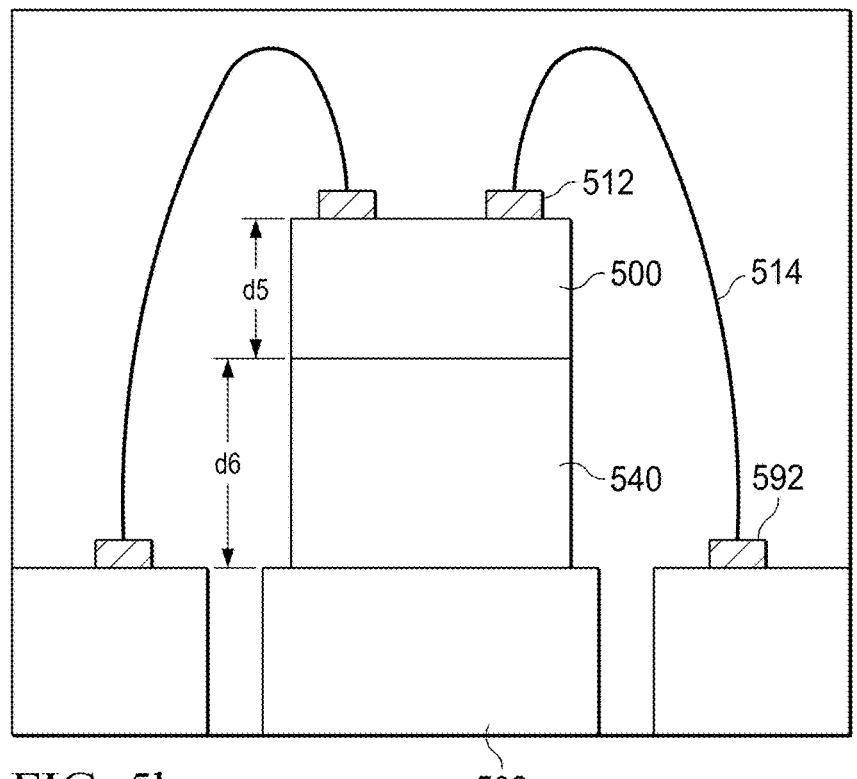
FIG. 5*b* shows an embodiment of a packaged component comprising a metal block on the backside.

FIG. 5b shows a packaged electric component comprising a component 500 having a thickness $d_5$ and a metal block 540 having a thickness $d_6$, wherein $d_6$ is substantially larger than $d_5$. The metal block 540 may comprise a heat sink. The metal block (e.g., copper) 540 may be soldered to the component carrier (e.g., lead frame) 590. One or more component contact pads 512 of the component 500 are connected via wires or conductive clips 514 to one or more component carrier contact pads 592 of the component carrier 590.

Figure 6A:
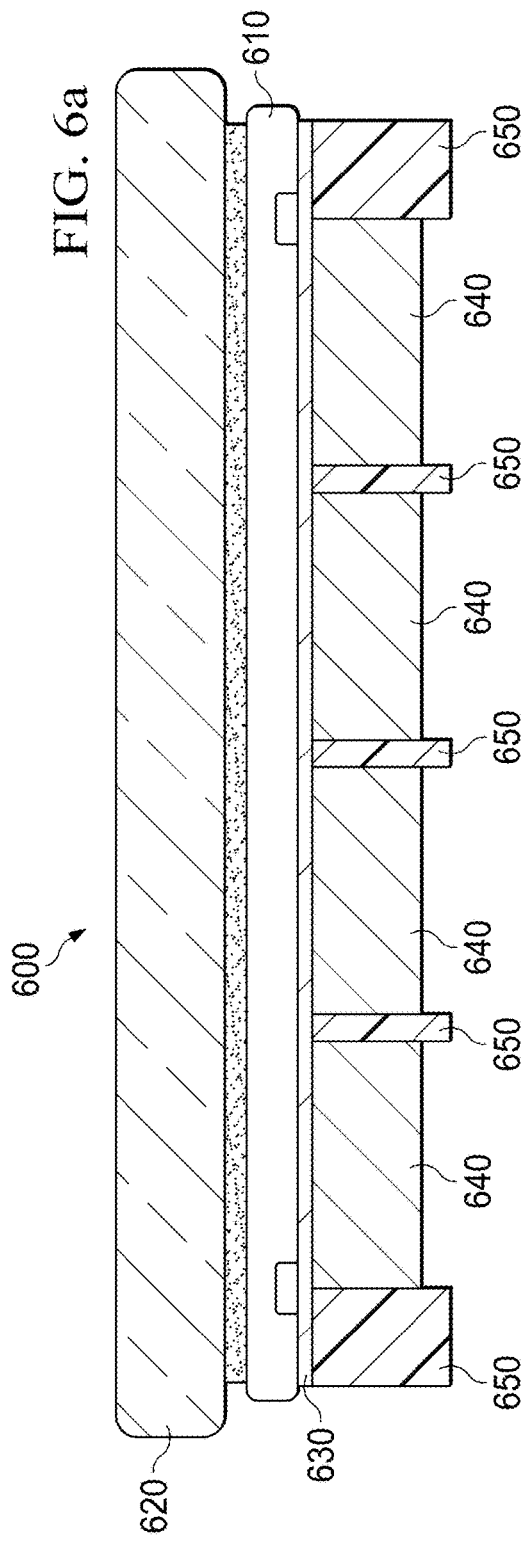
FIG. 6*a* shows an embodiment of a backside metal pattern arrangement.

FIG. 6a shows the backside metal pattern arrangement 600 in a flipped position. A wafer 610 is glued or connected to a glass carrier 620. The wafer 610 is connected to the glass carrier 620 on its front side. In this embodiment an alignment mark is arranged on its backside of the wafer 610. A seed layer or a seed layer together with an under-layer 630 is disposed directly adjacent to the wafer 610. The seed layer (together with the under-layer) 630 may comprise a metal layer stack. The seed layer 630 may cover the entire backside of the wafer 610. A metal pattern 640 (e.g., copper) is arranged over the seed layer/under-layer on the backside of the wafer 610. The wafer (e.g., substrate of the wafer) 610 comprises a thickness $d_7$ and the metal pattern 640 comprises a thickness $d_8$. The thickness $d_8$ is larger than the thickness $d_7$. The metal pattern 640 is structured by a resist pattern 650.

Figure 6B:
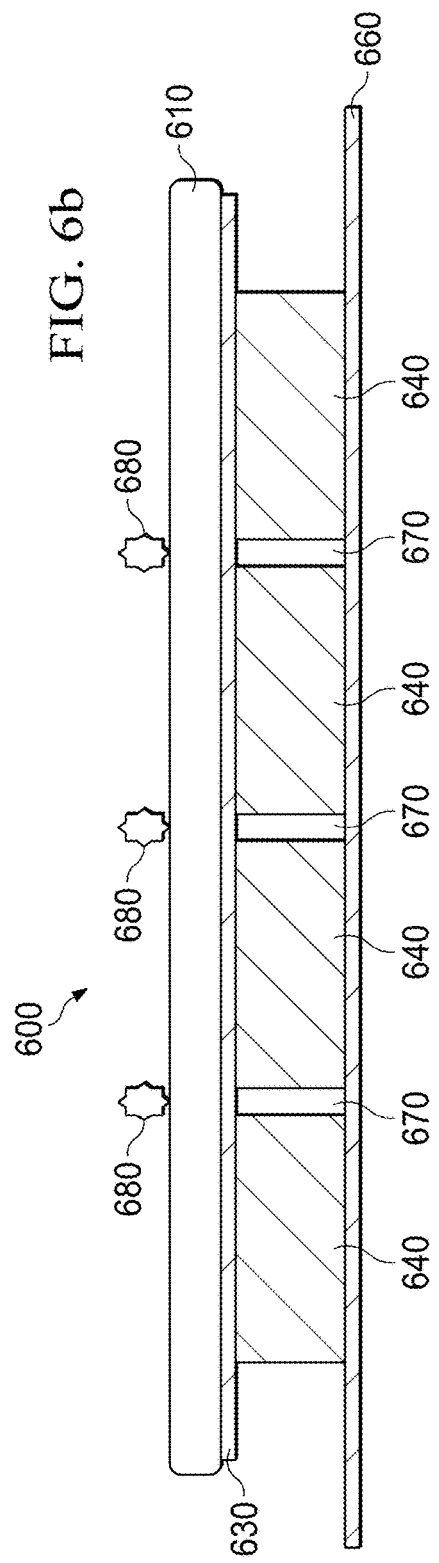
FIG. 6*b* shows an embodiment of a backside metal pattern arrangement.

FIG. 6b shows the backside metal pattern arrangement 600 after it is placed on a dicing foil 660. The resist pattern 650 and the glass carrier 620 have been removed. FIG. 6b shows the backside metal pattern arrangement 600 wherein the metal blocks 640 are separated by spaces or air gaps 670. The spaces or air gaps 670 are replacing the removed resist pattern 650. As FIG. 6b shows the wafer 610 is cut with a cutting tool 680 in and along the spaces or air gaps 670. The cutting tool 680 cuts through the wafer 610 and the under-layer/seed layer 630 but not through the metal pattern/blocks 640. The cutting tool 680 may be a dicing laser.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a plurality of components, the method comprising:
    mounting a carrier comprising a semiconductor substrate on a supporting glass carrier;
    processing the carrier to form a plurality of functional components, the plurality of functional components being separated from each other by kerf regions;
    after forming the kerf regions and the plurality of functional components, forming a metal pattern comprising a metal on a backside of the carrier, wherein the metal pattern covers the backside of the carrier except over regions corresponding to the kerf regions, wherein regions substantially vertically above the kerf region are free from the metal;
    removing the supporting glass carrier from the carrier; and
    separating the carrier into the plurality of components after removing the supporting glass carrier from the carrier,
    wherein a thickness of the carrier and a thickness of the metal pattern comprise substantially the same thickness, or wherein the thickness of the carrier is smaller than the thickness of the metal pattern, and
    wherein forming the metal pattern comprises forming a metal seed layer, forming an under-layer between the seed layer and the carrier, wherein the under-layer comprises a metal adhesion layer and a metal barrier layer, forming a patterned resist mask, and electroplating the metal pattern.

2. The method according to claim 1, wherein the metal pattern comprises copper (Cu).

3. The method according to claim 1, wherein a thickness of the carrier is about 20 µm or less, and wherein a thickness of the metal pattern is about 20 µm or more.

4. The method according to claim 1, wherein separating the carrier into the plurality of components comprises laser cutting the carrier along the regions.

5. A technique for manufacturing a plurality of components, the method comprising:
    mounting a carrier comprising a semiconductor substrate on a support carrier;
    processing the carrier to form a plurality of functional components and kerf regions, wherein the plurality of functional components are separated from each other by the kerf regions, wherein each of the plurality of functional components comprises a discrete device or an integrated circuit;
    after forming the kerf regions and the plurality of functional components, forming a metal pattern comprising a metal on a backside of the carrier, wherein the metal pattern comprises free standing metal blocks, wherein the metal pattern is separated by spaces, and wherein each metal block covers substantially an entire backside area of each functional component, wherein regions substantially vertically above the kerf region are free from the metal, wherein forming the metal pattern comprises:
        forming a metal seed layer;
        forming a patterned resist mask; and
        plating the metal pattern;
    forming an under-layer between the metal seed layer and the carrier, wherein the under-layer comprises a metal layer stack of aluminum and titanium, and wherein the metal seed layer comprises the same material as the metal pattern;
    removing the support carrier from the carrier; and
    separating the carrier into the plurality of components along the spaces after the removing.

6. The method according to claim 5, wherein the carrier comprises a thickness of about 20 µm or less, and wherein the metal pattern comprises a thickness of about 20 µm or more.

7. The method according to claim 6, wherein separating the carrier into the plurality of components comprises laser cutting the carrier.

8. The method according to claim 6, further comprising placing a component of the plurality of components on a leadframe, and encapsulating the component and at least a portion of the leadframe.

9. The method according to claim 8, wherein placing the component on the leadframe comprises wire bonding or clip bonding the component to the leadframe.

10. The method according to claim 5, wherein a thickness of the carrier and a thickness of the metal pattern are substantially equal or wherein the thickness of the carrier is smaller than the thickness of the metal pattern.

11. A method comprising:
    mounting a wafer comprising a semiconductor substrate on a support carrier;
    processing the wafer to form kerf regions and chips, wherein the chips are separated from each other by the kerf regions, wherein each chip comprises a discrete device or an integrated circuit, wherein the processing comprises thinning to expose a back surface, the wafer after the thinning having a front surface and the back surface;
    after forming the kerf regions and the chips, forming a metal pattern comprising a metal on the back surface of the wafer, wherein the metal pattern covers the back surface of the wafer except over regions substantially vertically above the kerf regions, wherein regions substantially vertically above the kerf region are free from the metal; and
    separating the wafer from the support carrier,
    wherein forming the metal pattern comprises forming a seed layer, and forming an under-layer between the seed layer and the back surface of the wafer, the under-layer including a metal adhesion layer and a metal barrier layer.

12. The method according to claim 11, wherein the metal pattern comprises copper (Cu).

13. The method according to claim 11, wherein forming the metal pattern further comprises:
patterning a photoresist over the seed layer; and
forming the metal pattern in a metal bath.

14. The method according to claim 11, wherein a thickness of the wafer and a thickness of the metal pattern are substantially equal or wherein the thickness of the wafer is smaller than the thickness of the metal pattern.

15. A method comprising:
processing a wafer to form kerf regions and chips, wherein the chips are separated from each other by the kerf regions, wherein each chip comprises a discrete device or an integrated circuit, and wherein the wafer comprises a front surface and a back surface;
thinning the wafer on the back surface;
after forming the kerf regions and the chips, forming a metal pattern comprising a metal on the back surface of the wafer, wherein regions substantially vertically above the kerf regions are free from the metal, wherein a thickness of the wafer and a thickness of the metal pattern are substantially equal or wherein the thickness of the wafer is smaller than the thickness of the metal pattern, and wherein forming the metal pattern comprises forming a seed layer, forming an under-layer between the seed layer and the back surface of the wafer, the under-layer including a metal adhesion layer and a metal barrier layer, patterning a photoresist over the seed layer, and forming the metal pattern in a metal bath; and
separating the wafer into the chips.

16. The method according to claim 15, wherein the discrete device comprises a transistors, a thyristor or a diode.

17. The method according to claim 15,
wherein the thickness of the wafer is smaller than the thickness of the metal pattern.

18. The method according to claim 15, wherein a thickness of the wafer and a thickness of the metal pattern are substantially equal.

* * * * *

UNITED STATES PATENT AND TRADEMARK OFFICE
CERTIFICATE OF CORRECTION

| | |
|---|---|
| PATENT NO. | : 10,186,458 B2 |
| APPLICATION NO. | : 13/542655 |
| DATED | : January 22, 2019 |
| INVENTOR(S) | : Mayer et al. |

Page 1 of 1

It is certified that error appears in the above-identified patent and that said Letters Patent is hereby corrected as shown below:

In the Claims

In Column 7, Line 62, Claim 5, delete "A technique for manufacturing" and insert --A method for manufacturing--.

Signed and Sealed this
Nineteenth Day of March, 2019

Andrei Iancu
*Director of the United States Patent and Trademark Office*